(12) United States Patent
Lundskog et al.

(10) Patent No.: US 9,337,389 B2
(45) Date of Patent: May 10, 2016

(54) GROUP-III NITRIDE STRUCTURE

(71) Applicant: Polar Light Technologies AB, Linkoping (SE)

(72) Inventors: Anders Lundskog, Villach (AT); Chih-Wei Hsu, Linkoping (SE); Fredrik Karlsson, Linkoping (SE)

(73) Assignee: POLAR LIGHT TECHNOLOGIES AB, Linköping (SE)

( * ) Notice: Subject to any disclaimer, the term of this patent is extended or adjusted under 35 U.S.C. 154(b) by 0 days.

(21) Appl. No.: 14/410,004

(22) PCT Filed: Jun. 26, 2013

(86) PCT No.: PCT/EP2013/063362
§ 371 (c)(1),
(2) Date: Dec. 19, 2014

(87) PCT Pub. No.: WO2014/001380
PCT Pub. Date: Jan. 3, 2014

(65) Prior Publication Data
US 2015/0144869 A1    May 28, 2015

(30) Foreign Application Priority Data
Jun. 26, 2012  (SE) ...................................... 1200384

(51) Int. Cl.
*H01L 33/24* (2010.01)
*H01L 33/00* (2010.01)
(Continued)

(52) U.S. Cl.
CPC ............ *H01L 33/24* (2013.01); *H01L 33/0075* (2013.01); *H01L 33/06* (2013.01); *H01L 33/18* (2013.01); *H01L 33/32* (2013.01); *H01L 33/16* (2013.01); *H01L 33/20* (2013.01)

(58) Field of Classification Search
USPC ......................................................... 257/13
See application file for complete search history.

(56) References Cited

U.S. PATENT DOCUMENTS 5,989,947 A * 11/1999 Dilger et al. .................. 438/172
6,233,267 B1 * 5/2001 Nurmikko et al. ....... 372/46.014
(Continued)

FOREIGN PATENT DOCUMENTS

EP    2333847 A1    6/2011

OTHER PUBLICATIONS

Edwards, P.R., et al. "Quantum dot emission from site-controlled InGaN/GaN micropyramid arrays" Applied Physics Letters, Nov. 8, 2004, 85(19):4281-4283.
(Continued)

*Primary Examiner* — Thao P Le
(74) *Attorney, Agent, or Firm* — Knobbe Martens Olson & Bear LLP (57) ABSTRACT

Group-III nitride structure comprising at least one structure pyramid having a base having at least four sides. The structure pyramid comprises an inner pyramid having a base having at least four sides, which inner pyramid is made of a first group-III nitride. The inner pyramid is coated with an inner first layer made of a second group-III nitride and an outer second layer made of a third group-III nitride, wherein the second group-III nitride has a lower band gap than the first group-III nitride and a lower band gap than the third group-III nitride. The base of the structure pyramid is elongated resulting in an upper ridge creating at least one anisotropic quantum dot.
Method for producing a group-III nitride structure comprising providing a substrate; providing a masking film on the substrate, which film comprises at least one elongated aperture; growth of a first group-III nitride on the substrate; deposition of an inner first layer of a second group-III nitride on the first group-III nitride; deposition of an outer second layer of a third group-III nitride on the second group-III nitride, wherein the second group-III nitride has a lower band gap than the first group-III nitride and a lower band gap than the third group-III nitride.

18 Claims, 3 Drawing Sheets

(51) Int. Cl.
  *H01L 33/06* (2010.01)
  *H01L 33/18* (2010.01)
  *H01L 33/32* (2010.01)
  *H01L 33/16* (2010.01)
  *H01L 33/20* (2010.01)

(56) References Cited

U.S. PATENT DOCUMENTS

| | | | | |
|---|---|---|---|---|
| 7,952,109 | B2 * | 5/2011 | Ng | 257/94 |
| 2003/0059971 | A1 * | 3/2003 | Chua et al. | 438/46 |
| 2008/0073743 | A1 * | 3/2008 | Alizadeh et al. | 257/461 |
| 2010/0074293 | A1 | 3/2010 | Lochmann et al. | |
| 2010/0216270 | A1 | 8/2010 | Liu et al. | |
| 2011/0062446 | A1 * | 3/2011 | Goyal | 257/64 |
| 2011/0103421 | A1 * | 5/2011 | Sharma et al. | 372/45.012 |
| 2012/0119237 | A1 * | 5/2012 | Leatherdale et al. | 257/88 |
| 2012/0291862 | A1 * | 11/2012 | Jiawook | 136/255 |
| 2015/0144869 | A1 * | 5/2015 | Lundskog et al. | 257/13 |

OTHER PUBLICATIONS

Holtz, P.O., et al. "Optical characterization of individual quantum dots" Physica B 407, 2012, 1472-1475.

Hsu, C.W. et al, "Single Excitons in InGaN Quantum Dots on GaN Pyramid Arrays" Nano Letters, 2011, 11, 2415-2418.

Tachibana, K. et al. "Selective growth of InGaN quantum dot structures and their microphotoluminescence at room temperature" Applied Physics Letters, May 29, 2000, 76(22):3212-3214.

Yuan, J. et al. "Controlling polarization anisotropy of site-controlled InAs/InP (100) quantum dots" Applied Physics Letter, 2011, 98(201904):1-3.

* cited by examiner

GROUP-III NITRIDE STRUCTURE

CROSS-REFERENCE TO RELATED APPLICATIONS

This application is the U.S. National Phase under 35 U.S.C. §371 of International Application PCT/EP2013/063362, filed Jun. 26, 2013, which claims priority to SE 1200384-4 filed Jun. 26, 2012.

TECHNICAL FIELD OF THE INVENTION

The present invention relates to a group-III nitride structure comprising at least one structure pyramid. The present invention also relates to a method for producing a group-III nitride structure comprising at least one structure pyramid.

TECHNICAL BACKGROUND

Some applications, such as liquid crystal display (LCD), are inherently dependent on linearly polarized light. The generation of polarized light is today mainly produced passively by filtering unpolarized light, which unavoidably reduces the device efficiency, or by the direct generation of polarized light by stimulated emission in laser devices.

The interest for group-III nitrides has grown rapidly during the last years. One reason is the semiconducting properties of group-III nitrides that may be utilised in light-emitting diodes (LED) and laser diodes (LD).

Semiconductor quantum dots (QDs) have an important role in various light-emitting diodes. For example, QDs incorporated in the active layer of a light emitting diode or a laser diode could improve their efficiency. Photons emitted from QDs posses specific energies that can be time-correlated and/or quantum-entangled and such single photon characteristics are promising for quantum cryptographic applications (QCA) and other quantum information applications (QIA).

In these applications, one QD represents an individual quantum light source and it is of importance that the QD can be positioned in a controllable manner in order to facilitate the subsequent device processing.

Pyramidal-structured templates which provide preferential formation locations for the QDs are a way of achieving site control of the QDs. The pyramids are achieved by putting a mask with holes in it over a grown layer and depositing a semiconductor material, which grows epitaxially on the grown layer, forming hexagonal pyramids. A layer of another semiconductor, denoted the active layer, is deposited over the pyramid and the active layer is in turn covered by the same material as the pyramid is made of. This active layer has a lower band gap than its surroundings, thus forming a quantum well (QW) and at the tip of the pyramid a quantum dot of the active layer is formed.

Sharp emission peaks are an evidence of three-dimensional quantum confinement with quantized energy levels of QDs. Single site-controlled QDs located at the apexes of hexagonal pyramids can give sharp emission lines. The emission energies can be tuned within a certain energy range by varying the growth temperature of the active layer in the pyramid. In addition, the emission lines of single QDs on various pyramids tend to be polarized in a certain direction.

This process has been shown to work for InGaN QDs on GaN pyramids grown in the <0001> direction with six equivalent faces of {10$\underline{1}$1} owing to the hexagonal wurtzite crystal symmetry of GaN. The characteristics of these single QDs and the ability to fabricate them in a controllable fashion show potential for the QDs as quantum light emitters (QLE).

The in-plane control of the light polarization is of great importance in a wide range of scientific and technological areas. Besides the solid state lightning applications, the fields of quantum cryptography are in need of a reliable single photon source which emits photons with deterministic polarization vectors. Such a polarization deterministic single photon source should preferably have a narrow spectral line width, have compatibility with modern electronics and allow room temperature operation.

To increase the usability of these QDs, it would also be preferred if the polarization direction of the emitted photons could be modified to include more directions and that those additional directions could be controllable. Thus, there exists a demand for an alternate direct or at least improved generation of polarized light. Consequently, there exists a demand for controlling the polarization direction of the emitted light in group-III nitride pyramid QDs.

SUMMARY OF THE INVENTION

One object of the present invention is to overcome at least some of the problems and drawbacks mentioned above. One object of the present invention is to obtain group-III nitride structures with direct generation of linearly polarized photons emitted from site-controlled light sources with individual and deterministic polarization vectors. One object of the present invention is to control the polarization direction of photons emitted from group-III nitride structures. One object of the present invention is to obtain group-III nitride structures as a photon source having a desired direction of polarization of its emitted photons. One object of the present invention is to obtain group-III nitride structures as a photon source having a narrow spectral line width. One object of the present invention is to obtain a group-III nitride structure as a photon source, having desired direction of polarization of its emitted photons, which is compatible with modern electronics and/or allows room temperature operation.

These and further objects are achieved by a group-III nitride structure comprising at least one structure pyramid having a base having at least four sides, wherein said structure pyramid comprises an inner pyramid having a base having at least four sides, which inner pyramid is made of a first group-III nitride, wherein the inner pyramid is coated with an inner first layer made of a second group-III nitride and an outer second layer made of a third group-III nitride, wherein the second group-III nitride has a lower band gap than the first group-III nitride and a lower band gap than the third group-III nitride, wherein the base of said structure pyramid is elongated resulting in an upper ridge creating at least one anisotropic quantum dot.

The group-III nitride structure of the present invention has polarizing properties. The group-III nitride structure of the present invention enables direct generation of linearly polarized photons emitted from site-controlled light sources with individual and deterministic polarization vectors. The group-III nitride structure of the present invention enables control of the polarization direction of photons emitted from group-III nitride structures. The group-III nitride structure of the present invention may be used as a photon source having a desired direction of polarization of its emitted photons. The group-III nitride structure of the present invention may be used as a photon source having a narrow spectral line width. The group-III nitride structure of the present invention may be used as a photon source having a desired direction of polarization of its emitted photons. The group-III nitride structure is compatible with modern electronics. Room temperature operation is allowed.

The above and further objects as well as the above advantages are also achieved by a method for producing a group-III nitride structure comprising providing a substrate; providing a masking film on the substrate, which film comprises at least one elongated aperture; growth of a first group-III nitride on the substrate, whereby an inner pyramid made of the first group-III nitride and having a base having at least four sides is obtained at the location of the at least one elongated aperture; deposition of an inner first layer of a second group-III nitride on the first group-III nitride; deposition of an outer second layer of a third group-III nitride on the second group-III nitride, wherein the second group-III nitride has a lower band gap than the first group-III nitride and a lower band gap than the third group-III nitride, whereby at least one structure pyramid having an elongated base having at least four sides is obtained at the location of the at least one elongated aperture and whereby the at least one structure pyramid has an upper ridge having at least one anisotropic quantum dot.

Further objects and features of the present invention will appear from the following detailed description of embodiments of the invention.

DETAILED DESCRIPTION

Figure 1:
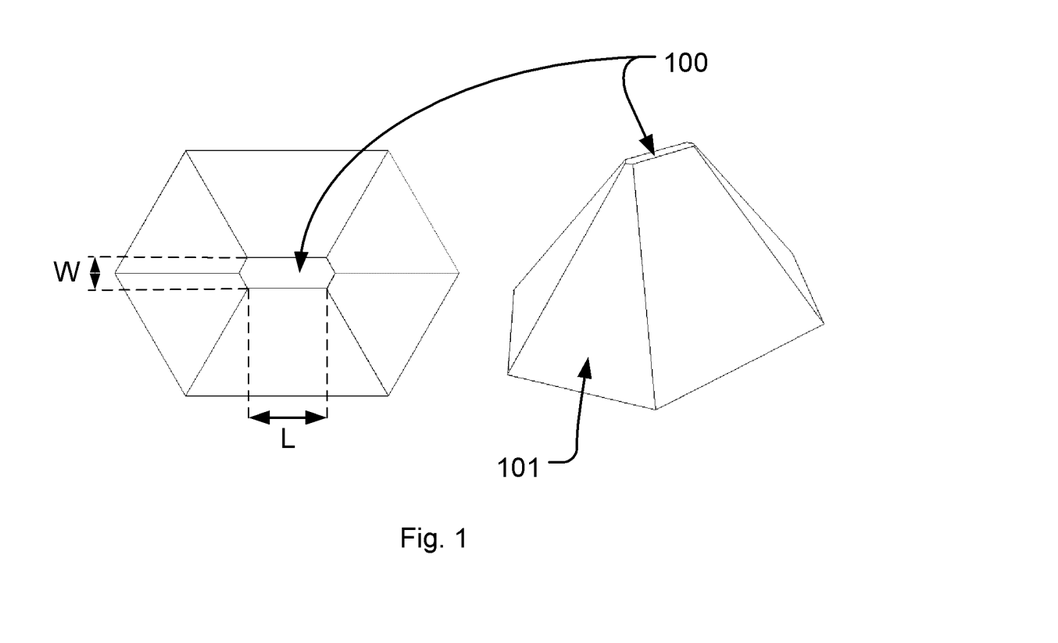
FIG. 1 shows a hexagonal pyramid from above and one from a perspective view.

As described above, the present invention relates to a group-III nitride structure comprising at least one structure pyramid having a base having at least four sides, wherein said structure pyramid comprises an inner pyramid having a base having at least four sides, which inner pyramid is made of a first group-III nitride, wherein the inner pyramid is coated with an inner first layer made of a second group-III nitride and an outer second layer made of a third group-III nitride, wherein the second group-III nitride has a lower band gap than the first group-III nitride and a lower band gap than the third group-III nitride, wherein the base of said structure pyramid is elongated resulting in an upper ridge creating at least one anisotropic quantum dot. FIG. 1 shows an elongated hexagonal pyramid from above and from a perspective view, where the upper ridge 100 is apparent.

By coating the inner pyramid with an inner first layer, an intermediate pyramid covering the inner pyramid is obtained. By coating the intermediate pyramid with an outer second layer, i.e. a capping layer, an outer pyramid covering the intermediate and the inner pyramid is obtained. By using group-III nitrides where the second group-III nitride has a lower band gap than the first and the third group-III nitride, a quantum dot is obtained, i.e. a three dimensional potential well is obtained. The quantum dot is obtained at the top of the structure pyramid. By having a base of the pyramid being elongated, an upper ridge 100, 200 of the pyramid is obtained. The upper ridge is elongated. By having an upper ridge, at least one anisotropic quantum dot is obtained. The obtained anisotropic quantum dot may e.g. be due to that the quantum dot takes an elongated shape or that anisotropic strain fields are present. Since the quantum dot is anisotropic, the group-III nitride receives a direction of polarization. Thus, the group-III nitride structure has linear polarizing properties. The direction of polarization may be related to the elongation of the quantum dot, i.e. the direction of the upper ridge. The direction of polarization is related to the direction of the elongation of the base of the pyramid. Thereby, the direction of polarization is controllable. The direction of polarization is controllable by orienting the elongation of the base of the pyramid.

In one embodiment, the third group-III nitride is the same as the first group-III nitride.

In one embodiment, the length of the base of the structure pyramid in the direction of the elongation is at least 0.2 µm larger than the width of the base of the structure pyramid. In one embodiment, the length of the base of the structure pyramid in the direction of the elongation is at least 0.4 µm, such as at least 0.6 µm, such as at least 0.8 µm, such as at least 1 µm, larger than the width of the base of the structure pyramid. In one embodiment, the length of the base of the structure pyramid in the direction of the elongation is at least 0.8 µm larger than the width of the base of the structure pyramid.

In one embodiment, the width (W) of the upper ridge is equal to or smaller than 300 nm. In one embodiment, the width of the upper ridge is equal to or smaller than 200 nm, such as equal to or smaller than 150 nm, such as equal to or smaller than 100 nm.

In one embodiment, the length (L) of the upper ridge is larger than the width (W) of the upper ridge.

In one embodiment, the at least one anisotropic quantum dot has an elongation in the direction of the upper ridge. In one embodiment, the at least one anisotropic quantum dot has an elongation in the direction of the elongated base of the structure pyramid.

In one embodiment, the base of each structure pyramid and each inner pyramid has at least six sides, as shown in FIGS. 1, 2, 3 and 5. When the base of the pyramids has six sides, the pyramids have hexagonal bases. In one embodiment, each structure pyramid and each inner pyramid has a hexagonal base. In one embodiment, each hexagonal base of the pyramids is an irregular hexagon. In one embodiment, each hexagonal base of the pyramids is elongated. In one embodiment, two opposite sides of the hexagonal base are longer than the other sides of the hexagonal base. In one embodiment, each irregular hexagon of the pyramids is an elliptic hexagon. An elliptic hexagon is a hexagon inscribed in an ellipse.

In one embodiment, the upper ridge is arranged in the direction of the elongated base of the structure pyramid, i.e. the elongation of the upper ridge is arranged in the direction of the elongation of the base of the structure pyramid. Thus, the longitudinal direction of the upper ridge is arranged in the longitudinal direction of the elongated base of the structure pyramid.

In one embodiment, the structure pyramid is a truncated pyramid. In one embodiment, the inner pyramid is a truncated pyramid.

In one embodiment, the group-III nitride structure further comprises a stratum of the first group-III nitride on which the at least one structure pyramid is located.

Figure 5:
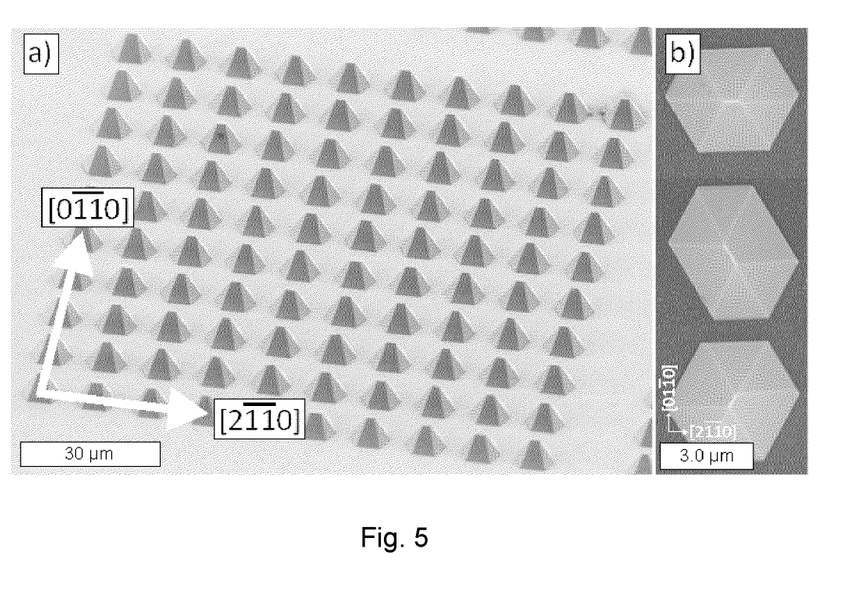
FIG. 5 shows a SEM (Scanning Electron Microscope) image of a group-III nitride structure according to the present invention having several structure pyramids.

In one embodiment comprising a stratum, the longitudinal direction of the elongated base of at least one structure pyramid is oriented in the [2$\underline{1}$10] direction of the group-III nitride of the stratum or rotated 30°, 60°, 90°, 120°, 150° or 180° in relation to the [2$\underline{1}$10] direction of the group-III nitride of the stratum. In one embodiment comprising a stratum, the longitudinal direction of the elongated base of at least one structure pyramid is oriented in the [21̄1̄0] direction of the group-III nitride of the stratum or rotated 60°, 120° or 180° in relation to the direction of the group-III nitride of the stratum. In FIG. 5b pyramids are shown which have been grown at 0°, 60° and 120°, respectively, in relation to the [2̄110] direction of the group-III nitride of the stratum, which corresponds to ridges aligned parallel to the [2̄110], [112̄0] and [1̄21̄0] directions. The pyramids are grown in these directions because of the crystal structure of the group-III nitride. The 0°, 60° and 120° orientations are preferred since in the case of hexagonal pyramids it will result in an elongated hexagonal ridge, while the 30°, 90° and 150° orientations will result in a rhombic apex.

In one embodiment, the stratum is made of the first group-III nitride. By using the same group-III nitride in both the stratum and the inner pyramid, the stresses and dislocations in the inner pyramid are reduced. In one embodiment, the stratum is made of the (0001) oriented group-III nitride GaN. When the inner pyramid is grown in the same group-III nitride, GaN, the crystal structure of the inner pyramid mimics the crystal structure of the underlying GaN. Pronounced {1̄101} facets, or side walls, converge to a narrow ridge elongated in the {2̄110} direction when the inner pyramid is allowed to grow for an appropriate amount of time. If allowed to grow for too long time, the elongated narrow ridge will become an elongated tip of the pyramid and if grown too short time, the ridge will be a wide plateau surface.

In case of wurtzite crystal structures, such as for gallium nitride, the quantum dots preferentially nucleate at the (0001) facet of the pyramidal structure Thereby, there is a restriction on the pyramidal structure shape and size (volume) in order to achieve photon polarization vector guidance; i.e. the 3D pyramidal structure should comprise more than 3 crystal facets enabling convergence to a narrow ridge.

In one embodiment, a structure has more than one pyramid and the pyramids hosting the quantum dots can be spatially positioned very close, such as below 25 µm, such as below 10 µm, such as about 6 µm inter-pyramid distance. In one embodiment, the pyramids has different orientation such that one structure can produce photons of different polarizations upon individual activation; by controlling which pyramid(s) that are optically active at a moment, the polarization of the emitted light can be dynamically controlled all the way down to single photon intensities.

As described above, the present invention also relates to a method for producing a group-III nitride structure comprising providing a substrate; providing a masking film on the substrate, which film comprises at least one elongated aperture; growth of a first group-III nitride on the substrate, whereby an inner pyramid made of the first group-III nitride and having a base having at least four sides is obtained at the location of the at least one elongated aperture; deposition of an inner first layer of a second group-III nitride on the first group-III nitride; deposition of an outer second layer of a third group-III nitride on the second group-III nitride, wherein the second group-III nitride has a lower band gap than the first group-III nitride and a lower band gap than the third group-III nitride, whereby at least one structure pyramid having an elongated base having at least four sides is obtained at the location of the at least one elongated aperture and whereby the at least one structure pyramid has an upper ridge having at least one anisotropic quantum dot.

Figure 2:
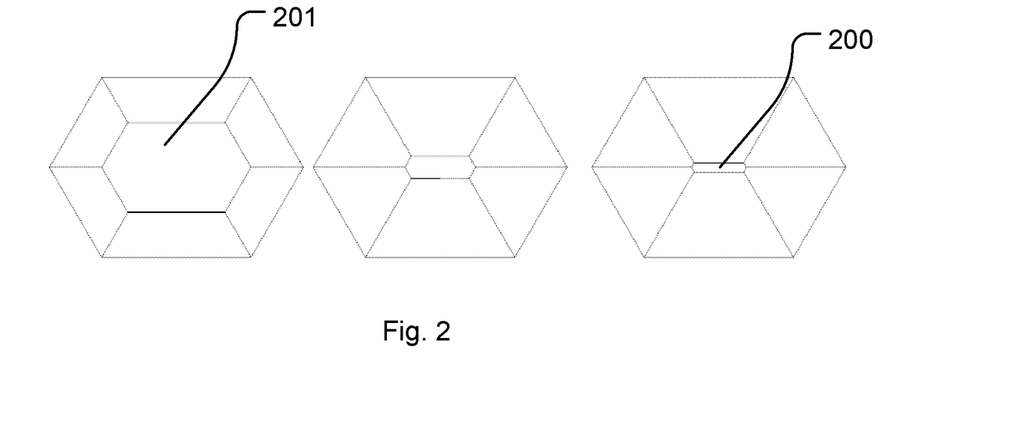
FIG. 2 shows different ridge sizes depending on the growth time of the pyramid.

FIG. 2 illustrates the shape and size of the upper ridge depending on when the growth of the pyramids is stopped. If the growth time is too short the ridge will not be a narrow ridge but a wide plateau 201. The first pyramid in the figure is grown with growth time t1, the second with t2 and the third t3 and in the case illustrated in FIG. 2 t1<t2<t3. Accordingly the elongated pyramids truncation area is tailored by the growth time.

Figure 3:
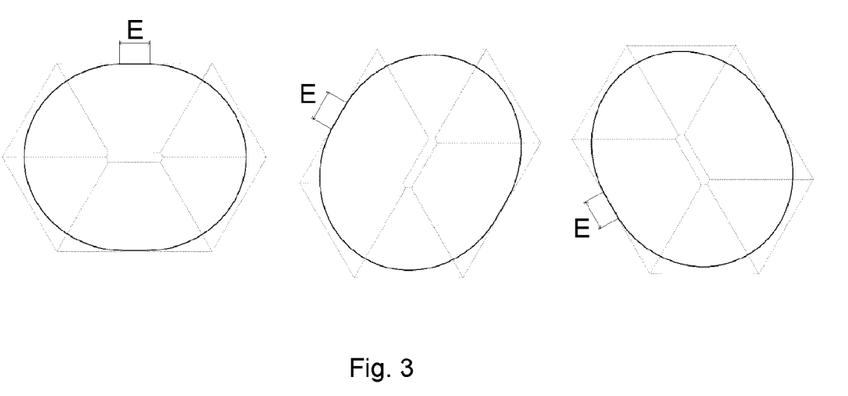
FIG. 3 shows the elongated holes in the mask and the corresponding hexagonal pyramids.

The elongated aperture in the masking film is illustrated in FIG. 3, where the elliptic shapes are the apertures in the film and the hexagonal shapes illustrate the resulting pyramid from above. E in the figure denotes the elongation of the aperture. The 0°, 60° and 120° growth directions are also illustrated in FIG. 3. Depending on the orientation of the aperture the pyramids grows in different directions.

Figure 4:
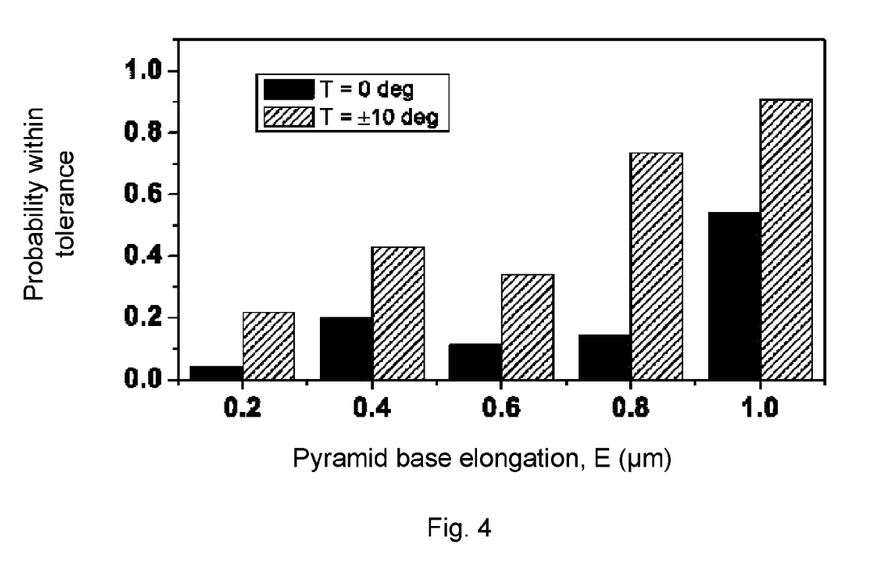
FIG. 4 shows polarization levels at different elongations of the pyramid base for group-III nitride structures according to the present invention.

FIG. 4 shows the probability to predict the polarization direction of the emitted light within a tolerance (T) of 0 and ±10 degrees for various E (see FIG. 3). The probability for polarization guiding varies nearly linearly with E. FIG. 4 shows that a polarization direction is achieved when elongating the base of the structure pyramid (E is at least 0.2 µm). The polarization guidance probability increases when the elongation (E) increases. When E is increased to 0.8 µm, the probability that the QD emission is aligned parallel to the ridge is about 0.75 when a tolerance of ±10 deg is applied, which is sufficient for most applications. For E=1.0 µm the probability that the QD emission is aligned parallel to the ridge is increased to about 0.90 when a tolerance of ±10 deg is applied, which is sufficient for many applications. When E is 0.6 µm a clear narrow distribution of polarization direction is observed in a different direction.

The masking film inhibits growth of the group-III nitrides except where the elongated aperture is located. The method enables production of a group-III nitride structure as detailed above. The group-III nitride structure obtained by the method exhibits controllable polarization direction as explained above.

In one embodiment, the length of the elongated aperture in the direction of the elongation is at least 0.2 µm larger than the width of the elongated aperture. In one embodiment, the length of the elongated aperture in the direction of the elongation is at least 0.4 µm, such as at least 0.6 µm, such as at least 0.8 µm, such as at least 1 µm larger than the width of the elongated aperture. In one embodiment, the length of the elongated aperture in the direction of the elongation is at least 0.8 µm larger than the width of the elongated aperture.

In one embodiment, the first group-III nitride is grown on the substrate until the width of the upper ridge after deposition of the first and second layers is equal to or smaller than 300 nm. In one embodiment, the first group-III nitride is grown on the substrate until the width of the upper ridge after deposition of the first and second layers is equal to or smaller than 200 nm, such as equal to or smaller than 150 nm, such as equal to or smaller than 100 nm.

The second layer is preferably thicker than a mono-layer and thinner than 300 nm.

In one embodiment, the elongated aperture is in the form of two half circles connected by a rectangle, where the width of the rectangle is equal to the diameter of the half circles and the length (E) of the rectangle is larger than 0. This can be seen in FIG. 3. An alternative way to describe this embodiment is that the elongated aperture is in the form of a rectangle with four rounded corners where the radii of the rounded corners is half the width of the rectangle and the length of the rectangle is longer than two radii. In one embodiment, the elongated aperture is an elliptic aperture.

In one embodiment, the length of the rectangle is at least 0.2 µm. In one embodiment, the length of the rectangle is at least 0.4 µm, such as at least 0.6 µm, such as at least 0.8 µm, such as at least 1 µm. In one embodiment, the length of the rectangle is at least 0.8 µm.

In one embodiment, the method further comprises the step growth of a stratum of the first group-III nitride on the substrate, on which stratum the masking film is provided and on which stratum the first group-III nitride is grown, which step is performed before providing a masking film on the substrate.

In one embodiment comprising growth of a stratum, the longitudinal direction of the elongated aperture is oriented in the [2$\bar{1}$10] direction of the group-III nitride of the stratum or rotated 30°, 60°, 90°, 120°, 150° or 180° in relation to the [2$\bar{1}$10] direction of the group-III nitride of the stratum. In one embodiment comprising growth of a stratum, the longitudinal direction of the elongated aperture is oriented in the [2$\bar{1}$10] direction of the group-III nitride of the stratum or rotated 60°, 120° or 180° in relation to the [2$\bar{1}$10] direction of the group-III nitride of the stratum.

In one embodiment, the growth of the first group-III nitride is homoepitaxial growth.

In one embodiment of the method, the group-III nitride structure is a group-III nitride structure according to an embodiment disclosed above and/or comprising a group-III nitride as described below.

A group-III nitride is a nitride of group-III elements, i.e. elements belonging to the group of boron (B), aluminium (Al), gallium (Ga), indium (In), thallium (Tl) and ununtrium (Uut).

By growing structures comprising gallium, aluminum, indium or a mixture thereof, the produced structure have advantageous semiconducting characteristics that may be used in LEDs or LDs.

In one embodiment, the group-III element of the first group-III nitride is gallium, aluminum, indium or a mixture thereof. The first group-III nitride may be a single group-III nitride, such as gallium nitride, aluminum nitride or indium nitride. Alternatively, the first group-III nitride may be a nitride comprising a mixture of metals, such as a combination of gallium and aluminum or gallium and indium or gallium, aluminum and indium. The first group-III nitride may be a nitride comprising a mixture of gallium and aluminum. The first group-III nitride may be gallium nitride, aluminum nitride, aluminum gallium nitride, indium gallium nitride or indium aluminum gallium nitride.

In one embodiment, the group-III element of the second group-III nitride is gallium, aluminum, indium or a mixture thereof. The second group-III nitride may be a single group-III nitride, such as gallium nitride, aluminum nitride or indium nitride. Alternatively, the second group-III nitride may be a nitride comprising a mixture of metals, such as a combination of gallium and aluminum or gallium and indium or gallium, aluminum and indium. The second group-III nitride may be a nitride comprising a mixture of gallium and aluminum. The second group-III nitride may be gallium nitride, aluminum nitride, aluminum gallium nitride, indium gallium nitride, aluminum indium nitride or indium aluminum gallium nitride.

In one embodiment, the group-III element of the third group-III nitride is gallium, aluminum, indium or a mixture thereof. The third group-III nitride may be a single group-III nitride, such as gallium nitride, aluminum nitride or indium nitride. Alternatively, the third group-III nitride may be a nitride comprising a mixture of metals, such as a combination of gallium and aluminum or gallium and indium or gallium, aluminum and indium. The third group-III nitride may be a nitride comprising a mixture of gallium and aluminum. The third group-III nitride may be gallium nitride, aluminum nitride, indium nitride, aluminum gallium nitride, indium gallium nitride or indium aluminum gallium nitride.

In one embodiment, the group-III element of the first group-III nitride is gallium or a mixture of metals including gallium. The first group-III nitride may be gallium nitride or a nitride comprising a mixture of metals of which one is gallium, such as aluminum gallium nitride, indium gallium nitride or indium aluminum gallium nitride. The first group-III nitride may be gallium nitride.

In one embodiment, the group-III element of the second group-III nitride is a mixture of metals including indium and gallium. The second group-III nitride may be indium gallium nitride or a nitride comprising a mixture of metals comprising indium and gallium, such as indium gallium nitride or indium aluminum gallium nitride. The first group-III nitride may be indium gallium nitride.

In one embodiment, the group-III element of the third group-III nitride is gallium or a mixture of metals including gallium. The third group-III nitride may be gallium nitride or a nitride comprising a mixture of metals of which one is gallium, such as aluminum gallium nitride, indium gallium nitride or indium aluminum gallium nitride. The third group-III nitride may be gallium nitride.

In one embodiment, the first group-III nitride is gallium nitride, the second group-III nitride is indium gallium nitride and the third group-III nitride is gallium nitride.

EXPERIMENTAL EXAMPLE

The complete structure of a structure was grown by a horizontal low pressure hot-wall metal organic chemical vapor deposition (MOCVD) system using trimethylgallium, trimethylindium, and $NH_3$ as precursors.

InGaN quantum dots were epitaxially grown upon a selectively grown asymmetric 3D nanostructure made of gallium-nitride (GaN). The pyramids were selectively grown through openings in a 30 nm thick SiN mask created by a UV-lithography/Reactive Ion Etching (RIE) processes. When the apertures are created with a conventional UV-lithography/RIE process, the position, density and area of the apertures can be precisely controlled in the μm-scale (nm-scale when electron beam lithography is applied). The mask openings consisted of square arrays (pitch of about 6.3 μm) of rounded rectangles with radii R=1.5 μm which equals half of the width of the rectangle. The lengths of the rounded rectangles were varied from 3.0 to 4.0 μm with 0.2 μm step incensement across the substrate, which corresponds to an elongation of the base of the structure pyramid of 0.2 μm, 0.4 μm, 0.6 μm, 0.8 μm and 1.0 μm, respectively.

When MOCVD growth is performed on such template of GaN with a SiN mask, growth selectively occurs in the SiN apertures which later evolve to 3D GaN nanostructures. The crystal structure of the selectively grown 3D GaN nanostructures mimics the underlying GaN template crystal structure, thus (0001) oriented GaN islands with pronounced {1$\bar{1}$01} facets form inside the SiN apertures. The oblique angle between the (0001) and {1$\bar{1}$01} facets are approximately 62 degrees thus the {1$\bar{1}$01} facets converge. In case of a perfectly symmetric SiN aperture, the {1$\bar{1}$01} facets ideally converge to a single point.

A sketch of mask openings is shown in FIG. 3 together with the resulting hexagonal pyramid as viewed from above. Also in FIG. 3 the internal parameter E for the elongation of the mask opening is illustrated. E=0.0 μm correspond to a circle. When the symmetry of the SiN apertures is broken by an elongation, the {1$\bar{1}$01} facets converge to a (0001) narrow ridge. The width W and length L of the ridge, as shown in FIG. 1, was about 90 nm and 1.2 μm respectively.

The pyramid base and subsequent InGaN QWs/QDs and GaN capping layer were grown at a growth temperature of 1030° C., 800° C. and 800° C. respectively. The template on which the elongated pyramids were grown upon was a 100 nm AlN nucleation layer, followed by a 2.0 μm GaN layer, deposited on a (0001) oriented on-axis 4H—SiC substrate. The growth time of the GaN pyramid bases, InGaN QWs/QDs, and GaN capping layer were set to 45, 1, and 10 min respectively.

The obtained structure comprising elongated pyramids is analyzed by SEM. Obtained SEM images are shown in FIG. 5.

A low temperature (4 K) μPL setup was employed to investigate the optical properties of the InGaN QDs/QWs. A continuous laser working at 266 nm was used as the excitation source. The laser was focused to a spot diameter of about 1.5 μm through a reflective objective. The emission was collected by the same objective and subsequently guided to a rotatable linear polarizer and finally into the monochromator with a 2400 grooves/mm grating and a spectral resolution of about 350 μeV in the studied wavelength regime. The polarization of photons emitted from the pyramids of the obtained structures was investigated. The probability to obtain the polarization direction of the emitted light within a tolerance (T) of 0 and ±10 degrees for various elongations E of the base of the structure pyramid are shown in FIG. 4.

The foregoing has described the principles, preferred embodiments and modes of operation of the present invention. However, the description should be regarded as illustrative rather than restrictive, and the invention should not be limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

What is claimed is:

1. Group-III nitride structure comprising at least one structure pyramid having a base having at least four sides, wherein said structure pyramid comprises an inner pyramid having a base having at least four sides, which inner pyramid is made of a first group-III nitride, wherein the inner pyramid is coated with an inner first layer made of a second group-III nitride and an outer second layer made of a third group-III nitride, wherein the second group-III nitride has a lower band gap than the first group-III nitride and a lower band gap than the third group-III nitride,
wherein the base of said structure pyramid is elongated resulting in an upper ridge creating at least one anisotropic quantum dot.

2. Group-III nitride structure according to claim 1, wherein the length of the base of the structure pyramid in the direction of the elongation is at least 0.2 μm larger than the width of the base of the structure pyramid.

3. Group-III nitride structure according to claim 2, wherein the length of the base of the structure pyramid in the direction of the elongation is at least 0.8 μm larger than the width of the base of the structure pyramid.

4. Group-III nitride structure according to claim 1, wherein the width of the upper ridge is equal to or smaller than 300 nm.

5. Group-III nitride structure according to claim 1, wherein the length of the upper ridge is larger than the width of the upper ridge.

6. Group-III nitride structure according to claim 1, wherein each of the structure pyramid and the inner pyramid has a hexagonal base.

7. Group-III nitride structure according to claim 1, further comprising a stratum of the first group-III nitride on which the at least one structure pyramid is located.

8. Group-III nitride structure according to claim 7, wherein the longitudinal direction of the elongated base of at least one structure pyramid is oriented in the [2$\bar{1}\bar{1}$0] direction of the group-III nitride of the stratum or rotated 30°, 60°, 90°, 120°, 150° or 180° in relation to the [2$\bar{1}\bar{1}$0] direction of the group-III nitride of the stratum.

9. Group-III nitride structure according to claim 8, wherein the longitudinal direction of the elongated base of at least one structure pyramid is oriented in the [2$\bar{1}\bar{1}$0] direction of the group-III nitride of the stratum or rotated 60°, 120° or 180° in relation to the [2$\bar{1}\bar{1}$0] direction of the group-III nitride of the stratum.

10. Method for producing a group-III nitride structure comprising
providing a substrate;
providing a masking film on the substrate, which film comprises at least one elongated aperture;
growth of a first group-III nitride on the substrate, whereby an inner pyramid made of the first group-III nitride and having a base having at least four sides is obtained at the location of the at least one elongated aperture;
deposition of an inner first layer of a second group-III nitride on the first group-III nitride;
deposition of an outer second layer of a third group-III nitride on the second group-III nitride, wherein the second group-III nitride has a lower band gap than the first group-III nitride and a lower band gap than the third group-III nitride,
whereby at least one structure pyramid having an elongated base having at least four sides is obtained at the location of the at least one elongated aperture and whereby the at least one structure pyramid has an upper ridge having at least one anisotropic quantum dot.

11. Method according to claim 10, wherein the length of the elongated aperture in the direction of the elongation is at least 0.2 μm larger than the width of the elongated aperture.

12. Method according to claim 11, wherein the length of the elongated aperture in the direction of the elongation is at least 0.8 μm larger than the width of the elongated aperture.

13. Method according to claim 10, wherein the first group-III nitride is grown on the substrate until the width of the upper ridge after deposition of the first and second layers is equal to or smaller than 300 nm.

14. Method according to claim 10, wherein the elongated aperture is in the form of two half circles connected by a rectangle, where the width of the rectangle is equal to the diameter of the half circles and the length of the rectangle is larger than 0.

15. Method according to claim 10, further comprising the step
growth of a stratum of the first group-III nitride on the substrate, on which stratum the masking film is provided and on which stratum the first group-III nitride is grown, which step is performed before providing a masking film on the substrate.

16. Method according to claim 15, wherein the longitudinal direction of the elongated aperture is oriented in the [2$\bar{1}\bar{1}$0] direction of the group-III nitride of the stratum or rotated 30°, 60°, 90°, 120°, 150° or 180° in relation to the [2$\bar{1}\bar{1}$0] direction of the group-III nitride of the stratum.

17. Method according to claim 16, wherein the longitudinal direction of the elongated aperture is oriented in the [2$\bar{1}\bar{1}$0] direction of the group-III nitride of the stratum or rotated 60°, 120° or 180° in relation to the [21$\underline{1}$0] direction of the group-III nitride of the stratum.

18. Method according to claim 10, wherein the group-III nitride structure is a group-III nitride structure according to any one of claims 1-9.

* * * * *